United States Patent
Smith et al.

(10) Patent No.: US 9,502,399 B1
(45) Date of Patent: Nov. 22, 2016

(54) DIODE STRING CIRCUIT CONFIGURATIONS WITH IMPROVED PARASITIC SILICON-CONTROLLED RECTIFIER (SCR) CONDUCTION DURING ELECTROSTATIC DISCHARGE (ESD) EVENTS

(71) Applicant: Silicon Laboratories Inc., Austin, TX (US)

(72) Inventors: Jeremy C. Smith, Austin, TX (US); Anirudh Oberoi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/752,236

(22) Filed: Jun. 26, 2015

(51) Int. Cl.
| | |
|---|---|
| H01L 29/66 | (2006.01) |
| H01L 27/02 | (2006.01) |
| H01L 29/87 | (2006.01) |
| H01L 29/735 | (2006.01) |
| H01L 29/732 | (2006.01) |

(52) U.S. Cl.
CPC ....... *H01L 27/0262* (2013.01); *H01L 27/0255* (2013.01); *H01L 29/732* (2013.01); *H01L 29/735* (2013.01); *H01L 29/87* (2013.01)

(58) Field of Classification Search
CPC .................. H01L 27/0255; H01L 27/0262; H01L 29/87; H01L 29/732; H01L 29/735
USPC .......... 257/107, 145, 146, 355, 499
See application file for complete search history.

(56) References Cited

U.S. PATENT DOCUMENTS

| | | | | |
|---|---|---|---|---|
| 2003/0116777 | A1* | 6/2003 | Yu | ........................ H01L 27/0255 257/106 |
| 2006/0262471 | A1* | 11/2006 | Van Camp | .......... H01L 29/7436 361/56 |
| 2014/0027815 | A1* | 1/2014 | Su | ........................ H01L 27/0262 257/146 |
| 2014/0035091 | A1 | 2/2014 | Smith | |

OTHER PUBLICATIONS

Su et al., "High CDM Resistant Low-Cap SCR for 0.9V Advanced CMOS Technology", Sep. 2013, 7 pgs.
Glaser et al., "SCR Operation Mode of Diode Strings for ESD Protection", ScienceDirect, 2007, 10 pgs.
Smith, "Snapback Inhibiting Clamp Circuitry for Mosfet ESD Protection Circuits", U.S. Appl. No. 14/149,112, filed Jan. 7, 2014, 33 pgs.
Smith et al., "Diode Circuit Layout Topology With Reduced Lateral Parasitic Bipolar Action", U.S. Appl. No. 14/177,670, filed Feb. 11, 2014, 30 pgs.

* cited by examiner

*Primary Examiner* — Long K Tran
(74) *Attorney, Agent, or Firm* — Egan Peterman Enders Huston

(57) ABSTRACT

Diode string configurations are provided that employ one or more guard bars ($G_{BARS}$) positioned adjacent an end diode structure of a diode string to create a parasitic silicon-controlled rectifier (SCR) coupling between the end diode structure and the guard bar/s that operates to discharge current of an ESD event through a lateral parasitic bipolar transistor of the SCR and away from the individual diodes of the diode string. One or more of the disclosed guard bars may be positioned adjacent to a diode on a first end of a diode string to create a lateral SCR coupling for ESD discharge away from all of the diodes in the diode string without requiring positioning of a last diode on an opposite end of the same diode string adjacent the first terminal diode.

20 Claims, 6 Drawing Sheets

DIODE STRING CIRCUIT CONFIGURATIONS WITH IMPROVED PARASITIC SILICON-CONTROLLED RECTIFIER (SCR) CONDUCTION DURING ELECTROSTATIC DISCHARGE (ESD) EVENTS

FIELD OF THE INVENTION

This invention relates to diode string circuitry and, more particularly, to parasitic bipolar circuit configurations for diode string circuitry.

BACKGROUND

Electrostatic discharge (ESD) refers to the phenomenon whereby an electrical current of high magnitude and short duration is discharged at the package terminals of an integrated circuit due to static charge build-up on the integrated circuit (IC) package or on a nearby object, such as a human being or an IC handling machine. Without ESD protection circuitry, an ESD event can damage the IC. Accordingly, circuit designers have developed ESD protection circuitry to discharge ESD currents in a short time in a nondestructive manner A diode string represents one type of ESD circuit that can be used to discharge ESD currents. The diode string is formed in bulk material of a semiconductor substrate by series-connected P-N junctions typically formed in nwell regions. In particular, each n-well formed in the P-type bulk material is tapped via an n+ diffusion and is connected to the p+ junction of the next diode. The combination of a P+ diffusion contained in an nwell over a P-type substrate forms a parasitic PNP transistor by default, such that the "diode string" is really a chain of PNP transistors. Within the diode string, each PNP transistor has a vertical current gain ($\beta$), which effects the diode string operation, including the total substrate current, the effective on resistance ($R_{ON}$), and so on.

As the process technologies advance and the semiconductor technology scales, the vertical current gain ($\beta$) also tends to get smaller due to the n-well retrograde doping profile, in order to fight latch-up. Unfortunately, as the vertical current gain ($\beta$) decreases, the on-resistance ($R_{ON}$) of the diode string increases, which can adversely impact the performance of the diode string in response to an ESD event by reducing the amount of current shunted to the substrate. In general, shunting current to the substrate provides an extra current path which contributes to lowering the effective resistance otherwise exhibited by the series connection of diodes.

One type of ESD protection circuit includes interconnections between diode strings of adjacent input/output (I/O) pads to implement distributed diode strings. This configuration is described in United States Patent Application Publication 2014/0035091, which is incorporated herein by reference in its entirety for all purposes. Distributing the ESD event through multiple, smaller parallel diode strings makes it possible to use tapered diode strings to reduce the cell height of the diode strings without reducing ESD protection.

SUMMARY

Disclosed herein are diode string configurations that employ one or more guard bars ($G_{BARS}$) positioned adjacent to the end diode structure of a diode string to create a parasitic silicon-controlled rectifier (SCR) between the end diode structure and the guard bar/s, that operates to discharge current of an ESD event through a combination of lateral parasitic bipolar transistor action to the guard bar and the vertical PNP action of the end diode of the SCR and away from the remaining diodes of the diode string. The guard bar/s may include a doped diffusion of a single N+ conductivity type formed within a nwell of the guard bar/s such that the doped N+ diffusion has the same n-type conductivity as a nwell of the adjacent end diode structure. The doped N+ diffusion of the guard bar/s may be present in the nwell of the guard bar/s without the presence of the other (opposite) p-type conductivity material, i.e., the guard bar/s may be formed only of n-type material with no p-type material present in the guard bar/s.

In one exemplary embodiment, one or more of the disclosed guard bars may be positioned adjacent to a first diode on a first end of a diode string to create a lateral SCR coupling for ESD discharge away from all of the diodes in the diode string without requiring positioning of a last diode on an opposite end of the same diode string adjacent the first terminal diode, i.e., the lateral SCR coupling is not formed between the first diode and the last diode but rather is formed between the first diode and one or more guard bars. In this way, ESD discharge performance may be improved over that exhibited by conventional diode strings without requiring location of the last diode of a diode string to a position adjacent the first diode in the string, i.e., the last diode of the diode string may be separated from the first diode of the diode string by one or more other diodes, and/or the last diode string may be located on a different semiconductor layer than the first diode of the diode string. The disclosed diode string configurations may be employed in one embodiment to provide ESD protection for high-voltage tolerant applications.

In one exemplary embodiment, diode string configurations may employ one or more N+/nwell guard bars ($G_{BARS}$) positioned adjacent a P+/nwell diode structure of a diode string to create a lateral parasitic silicon-controlled rectifier (SCR) coupling between the P+/nwell diode structure and the N+/nwell guard bar/s that operates to discharge current of an ESD event through a combination of lateral parasitic NPN transistor and the vertical PNP transistor of the first diode of the SCR and away from the individual diodes of the diode string. In such an embodiment, one or more of the disclosed guard bars may be positioned adjacent to a first diode on a first end of a diode string to create a SCR coupling for ESD discharge away from all of the diodes in the diode string without requiring positioning of a nwell of the last diode (on an opposite end of the same diode string) adjacent to an nwell of the first diode, i.e., the SCR coupling is not formed between the nwell of the first diode and the nwell of the last diode but rather is formed between the nwell of the first diode and the nwell of the one or more guard bars. Thus, in this embodiment, the location of the nwell of the last diode of the diode string is not positioned adjacent the nwell of the first diode in the string.

In one respect, disclosed herein is a semiconductor circuit device, including: a semiconductor substrate; a diode string including two or more nwell diode structures formed in the substrate, each of the nwell diode structures including at least one N+ doped region and at least one P+ doped region, the N+ doped regions and P+ doped regions of the individual nwell diode structures being electrically coupled together in series to form a diode string having a first nwell diode structure disposed at a first end of the diode string and a last nwell diode structure disposed at a second and opposite end of the diode string; and at least one N+ doped/nwell guard bar formed in the substrate adjacent at least one side of the first nwell diode structure with no other well structure physically disposed in the substrate between the first nwell diode structure and the N+ doped/nwell guard bar, the N+ doped/nwell guard bar being electrically coupled to a first power supply rail of the semiconductor device. The semiconductor substrate may be electrically coupled to a second power supply rail of the semiconductor device that is different than the first power supply rail, and the at least one N+ doped/nwell guard bar may be positioned adjacent the first nwell diode structure to create a silicon-controlled rectifier (SCR) between the first diode structure and the N+ doped/nwell guard bar through the semiconductor substrate.

In another respect, disclosed herein is electrostatic discharge (ESD) protection circuitry, including: a semiconductor substrate; and a diode string including two or more nwell diode structures formed in the substrate, each of the nwell diode structures including at least one N+ doped region and at least one P+ doped region, the N+ doped regions and P+ doped regions of the individual nwell diode structures being electrically coupled together in series to form a diode string having a first nwell diode structure disposed at a first end of the diode string and a last nwell diode structure disposed at a second and opposite end of the diode string. At least one N+ doped/nwell guard bar may be formed in the substrate adjacent at least one side of the first nwell diode structure with no other well structure physically disposed in the substrate between the first nwell diode structure and the N+ doped/nwell guard bar, with the N+ doped/nwell guard bar being electrically coupled to a first power supply rail. The semiconductor substrate may be electrically coupled to a second power supply rail that is different than the first power supply rail, and the at least one N+ doped/nwell guard bar may be positioned adjacent the first nwell diode structure to create a silicon-controlled rectifier (SCR) between the first diode structure and the N+ doped/nwell guard bar through the semiconductor substrate. A P+ doped region of the first nwell diode structure may be electrically coupled to an output buffer signal node and an N+ doped region of the last nwell diode structure may be coupled to first power supply rail. The N+ doped/nwell guard bar may be electrically coupled to the first power supply rail, and the SCR may be configured to discharge current of an electrostatic discharge (ESD) event from the output buffer signal node to the first power supply rail through the N+ doped/nwell guard bar.

In another respect, disclosed herein is a method, including using a silicon-controlled rectifier (SCR) to discharge current of an electrostatic discharge (ESD) event from a diode string to a first power supply rail of a semiconductor device through a N+ doped/nwell guard bar. The diode string may include two or more nwell diode structures formed in a semiconductor substrate, each of the nwell diode structures including at least one N+ doped region and at least one P+ doped region, the N+ doped regions and P+ doped regions of the individual nwell diode structures being electrically coupled together in series to form the diode string having a first nwell diode structure disposed at a first end of the diode string and a last nwell diode structure disposed at a second and opposite end of the diode string. At least one N+ doped/nwell guard bar may be formed in the substrate adjacent at least one side of the first nwell diode structure with no other well structure physically disposed in the substrate between the first nwell diode structure and the N+ doped/nwell guard bar, the N+ doped/nwell guard bar being electrically coupled to the first power supply rail. The semiconductor substrate may be electrically coupled to a second power supply rail of the semiconductor device that is different than the first power supply rail, and the at least one N+ doped/nwell guard bar may be positioned adjacent the first nwell diode structure to create the SCR between the first diode structure and the N+ doped/nwell guard bar through the semiconductor substrate.

DESCRIPTION OF ILLUSTRATIVE EMBODIMENTS

Figure 1:
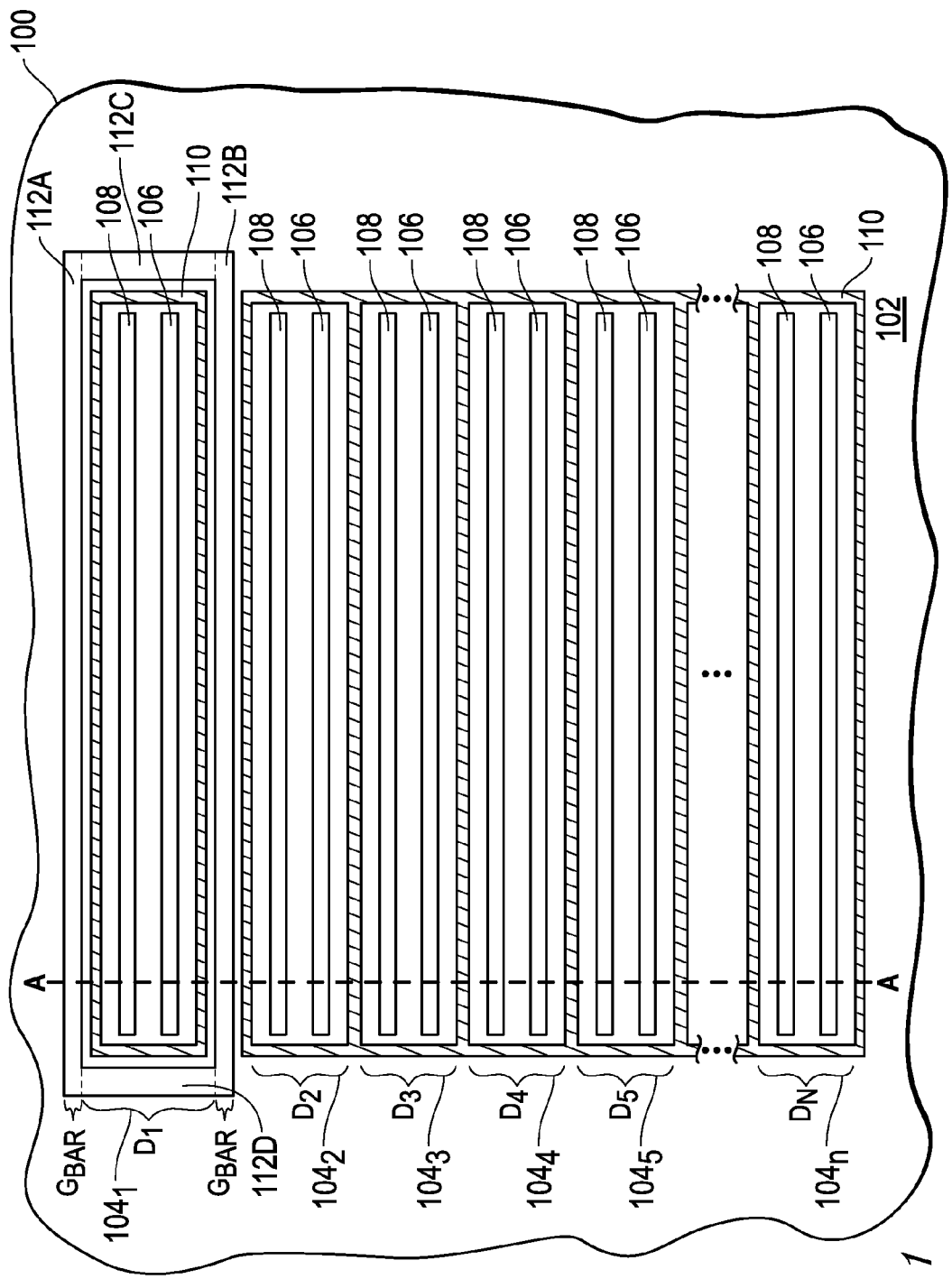
FIG. 1 illustrates an overhead view of a layout topology for a diode string according to one exemplary embodiment of the disclosed systems and methods.
Figure 2:
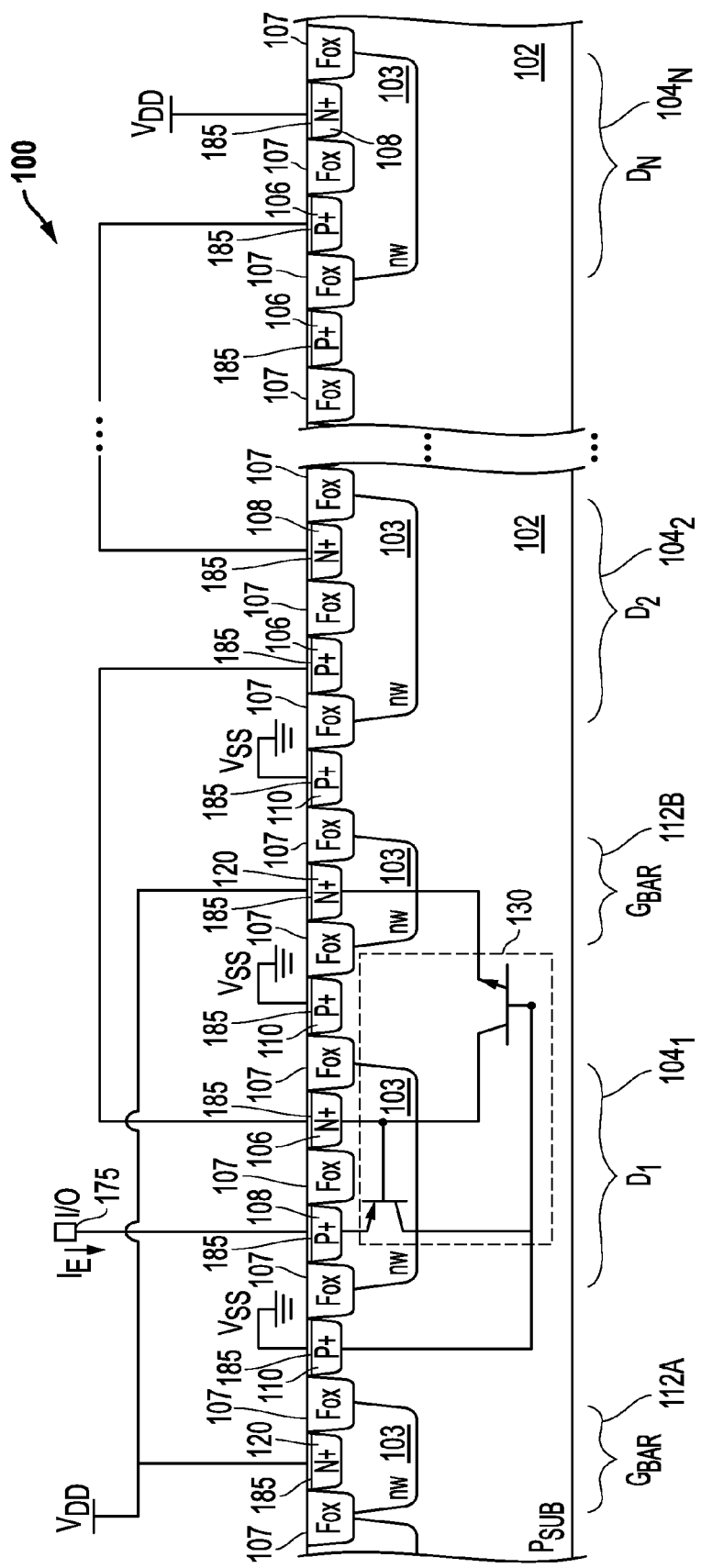
FIG. 2 illustrates a partial cross-sectional view of a layout topology for a diode string according to one exemplary embodiment of the disclosed systems and methods.

FIGS. 1 and 2 illustrate one exemplary embodiment of a layout topology for diode string 100. The circuit topology of diode string 100 and other diode string embodiments described herein may be employed, for example, as ESD diodes coupled in series between output signal pad and positive power supply rail ($V_{DD}$) in signal output circuitry such as described in United States Patent Application Publication 2014/0035091, which is incorporated herein by reference in its entirety. Other examples of signal output circuitry having output buffer circuitry are described in U.S. patent application Ser. No. 14/149,112 filed Jan. 7, 2014, which is also incorporated herein by reference in its entirety. Although described herein in relation to ESD diode strings coupled in series between output signal pad and positive power supply rail ($V_{DD}$) in signal output circuitry such as described in the above references, it will be understood that the disclosed diode strings may alternatively or additionally be employed in a similar manner as ESD diodes coupled in series between an output signal pad and negative power supply rail ($V_{SS}$) of signal output circuitry described in the above references.

In FIGS. 1 and 2, diode string 100 includes a number of N diodes 104 ($D_1$ to $D_N$) coupled together in series, however any number of two or more diodes 104 may be coupled together in a similar manner so as to present a desired turn-on voltage, which is determined by the sum of the built-in potential of each of the diodes 104 in the string. In the embodiment of FIGS. 1 and 2, diode string 100 includes a first diode $104_1$ ($D_1$) having a P+ anode terminal coupled to an I/O pad 175 (e.g., an output signal node or pad of an output buffer circuit of signal output circuitry) via a conductive layer region 185 (metal such as metal silicide or salicide) and a N+ cathode terminal that is tied to the P+ anode terminal of a second diode $104_2$ ($D_2$) via a conductive layer region 185 (metal such as metal silicide or salicide). A last diode $104_N$ ($D_N$) in diode string 100 has a P+ anode terminal coupled to a N+ cathode terminal of a previous diode 104 in diode string 100 via conductive layer region 185 and has a N+ cathode terminal coupled to a terminal 177 of power supply ($V_{DD}$) 502 via a conductive layer region 185. It will be understood that one or more such diode strings 100 may be coupled in parallel between an I/O 175 pad and such a terminal 177 of $V_{DD}$ 502. As previously mentioned, in an alternative embodiment one or more diode strings 100 may be coupled in similar manner between an I/O 175 pad and a $V_{SS}$ terminal.

Referring to exemplary overhead layout topology view of FIG. 1 and corresponding cross-sectional view of FIG. 2, each diode 104 of diode string 100 includes two parallel elongated N+ doped regions 106 and P+ doped regions 108 that are formed between field oxide regions 107 within an nwell 103 (oxide 107 not shown in FIG. 1), which itself is formed in a P-type substrate 102 as shown in FIG. 2. It will be understood that diodes 104 may be of any other suitable configuration and including more than two parallel elongated N+ doped regions 106 and P+ doped regions 108, e.g., such as the alternate diode embodiments illustrated in FIGS. 3 and 4 which each employ a different combination of three parallel elongated N+ doped regions 106 and P+ doped regions 108. It will also be understood that diode geometry may vary and that it is alternatively possible that diode string diodes may include non-elongated (e.g., such as square-shaped) N+ doped regions and P+ doped regions that are formed between field oxide regions within an nwell.

As shown in FIGS. 1 and 2, a corresponding P+ doped guard ring structure 110 is formed to continuously surround and laterally enclose each pair of parallel elongated N+ doped regions 106 and P+ doped regions 108 in P-type substrate 102, and is coupled via a conductive layer region 185 to a negative supply rail ($V_{SS}$). Also present in this embodiment are N+/nwell guard bars ($G_{BARS}$) 112 positioned adjacent the P+/nwell diode structure of first diode $104_1$ of diode string 100 and having N+ doped regions 120 coupled via a conductive layer region 185 to positive supply rail ($V_{DD}$) so as to create a parasitic silicon-controlled rectifier (SCR) 130 shown in FIG. 2 that includes vertical parasitic PNP and lateral parasitic NPN transistors, and that electrically couples the P+ doped region 108 of first diode $104_1$ to the N+/nwell guard bar/s 112 to discharge current ($I_E$) of an ESD event to I/O pad 175 through the lateral parasitic NPN transistor of the SCR 130 and away from the individual diodes $104_2$ to $104_N$ of the diode string 100. In one embodiment, a guard bar may be a collecting diffusion that is present within a semiconductor substrate as a stripe (or other suitable shape) of n-type active material formed in a n-type active material well that is positioned adjacent (e.g., positioned parallel to or otherwise in a similar or same orientation relative to) a diode well of the same n-type conductivity that includes a diffusion of the same n-type conductivity.

In this regard, during such an ESD event, diodes $104_1$ to $104_N$ form a string of parasitic bipolar PNP transistors that in the absence of SCR 130 would each "dump" or otherwise discharge a portion of ESD current to ground ($V_{SS}$) via an adjacent P+ doped region 108. However, upon activation of the vertical and lateral parasitic bipolar transistors of the SCR 130, ESD current from the individual diode structures is instead discharged though the lateral parasitic NPN transistor of the SCR 130 via the N+/nwell guard bars ($G_{BARS}$) 112.

It will be understood that one or more guard bars 112 may be provided in position adjacent one or more sides of a first diode $104_1$ of a diode string 100, and with no other diodes 104 positioned between the guard bar/s 112 and the first diode $104_1$, and in a further embodiment with no other well (e.g., nwell or pwell) positioned between the guard bar/s 112 and the first diode $104_1$. In this regard, FIG. 1 illustrates multiple guard bars 112A, 112B, 112C and 112D, which in this case are contiguous and joined as one structure to form a continuous N+/nwell guard bar ring around first diode $104_1$. However, it will be understood that any one or more of N+/nwell guard bars 112A, 112B, 112C and 112D may be provided adjacent a first diode $104_1$ in a given embodiment that is suitably spaced relative to the nwell 103 of the first diode $104_1$ to create a SCR 130 that is triggered during occurrence of an ESD event on I/O pad 175. In one exemplary embodiment, N+/nwell guard bar/s 112 may be operatively spaced adjacent an nwell 103 of a first diode $104_1$ such that the product of the β of the vertical parasitic PNP bipolar device of SCR 130 and the β of the horizontal parasitic NPN bipolar device of SCR 130 is greater than or equal to 1.

In one exemplary embodiment, N+/nwell guard bar/s 112 may be operatively spaced from about 1 micron to about 20 microns (alternatively from about 1 micron to about 10 microns, alternatively from about 1 micron to about 6 microns, and further alternatively from about 1 micron to about 3 microns) from nwell 103 of first diode 104. In another exemplary embodiment, N+/nwell guard bar/s 112 may be operatively spaced from about 3 microns to about 20 microns (alternatively from about 3 microns to about 10 microns, alternatively from about 3 microns to about 6 microns, alternatively from about 6 microns to about 20 microns, alternatively from about 6 microns to about 10 microns, and further alternatively from about 10 microns to about 20 microns) from nwell 103 of first diode 104.

Figure 3:
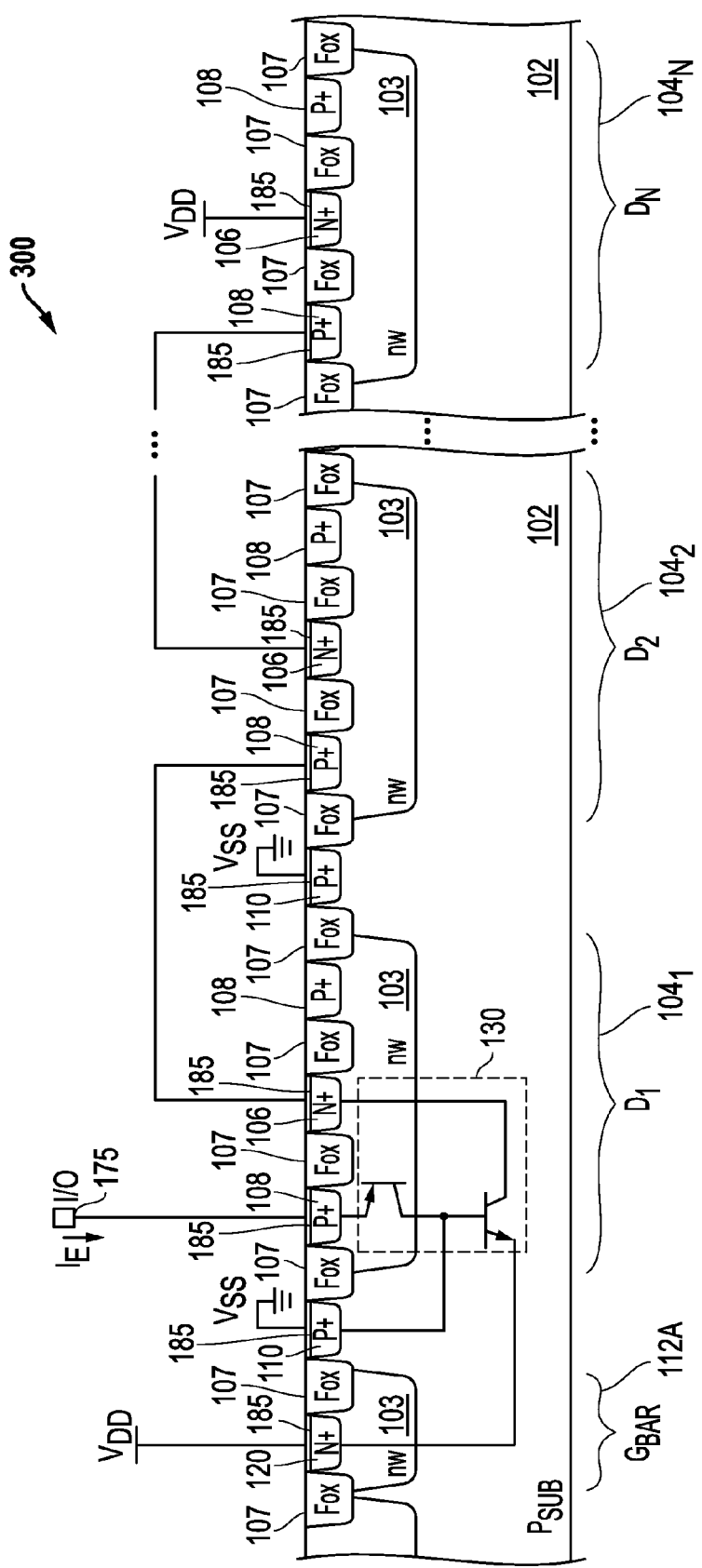
FIG. 3 illustrates a partial cross-sectional view of a layout topology for a diode string according to one exemplary embodiment of the disclosed systems and methods.
Figure 4:
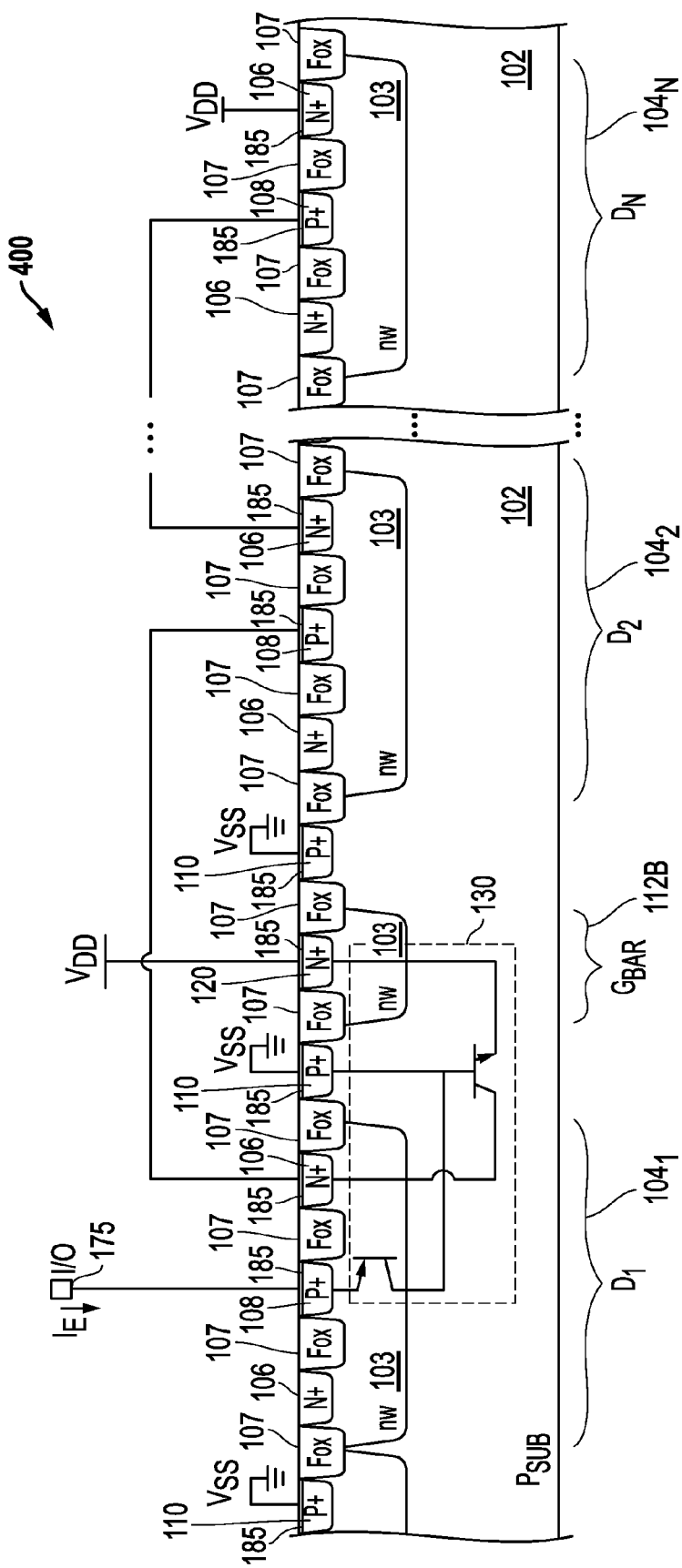
FIG. 4 illustrates a partial cross-sectional view of a layout topology for a diode string according to one exemplary embodiment of the disclosed systems and methods.

FIGS. 3 and 4 illustrate just two of the other possible alternative embodiments of diode string configuration that may be implemented with N+/nwell guard bar/s positioned adjacent a P+/nwell diode structure to create a SCR for discharging ESD current ($I_E$) from the diode string. For example, FIG. 3 illustrates an alternate embodiment in which only a single N+/nwell guard bar 112A is provided adjacent first diode $104_1$ on one edge of diode string 300 in order to create an SCR 130 that operates in similar manner as described for SCR 130 of FIG. 1 upon occurrence of an ESD event to I/O pad 175 diode string 300. In the alternate embodiment of FIG. 4, only a single N+/nwell guard bar 112B is provided adjacent first diode $104_1$ and between first diode $104_2$ and second diode $104_2$ in order to create an SCR 130 that operates in similar manner as described for SCR 130 of FIG. 1 upon occurrence of an ESD event to I/O pad 175 diode string 400.

Figure 5A:
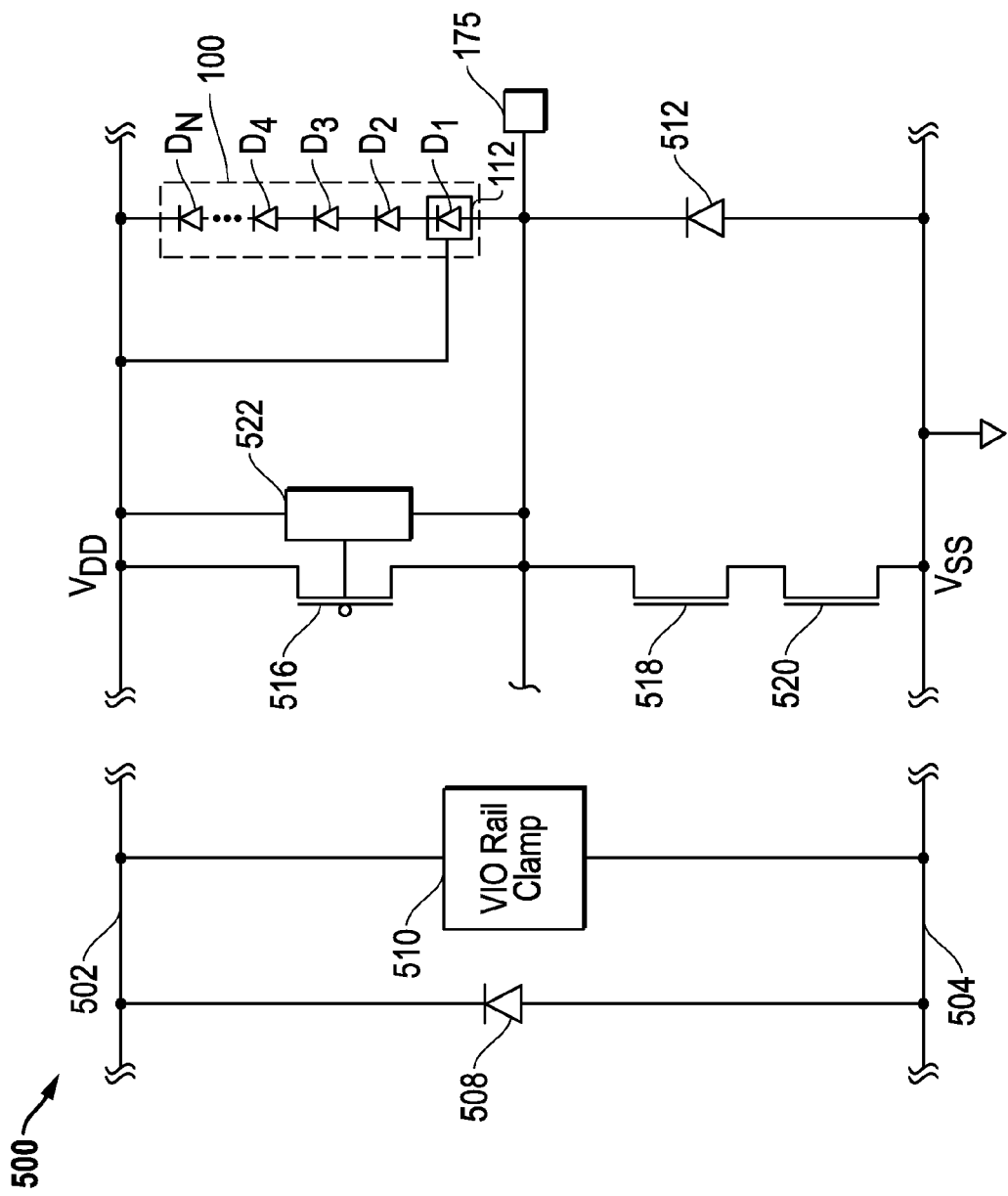
FIG. 5A illustrates signal output circuitry according to one exemplary embodiment of the disclosed circuit topologies and methods.

FIG. 5A illustrates one exemplary embodiment of signal output circuitry 500 configured with ESD protection circuitry that includes a diode string 100 of N diodes $D_1$ to $D_N$ that is coupled between I/O pad 175 and $V_{DD}$. It will be understood that the embodiment of FIG. 5A is exemplary only and that other configurations or ESD circuitry may be implemented using the disclosed diode strings having one or more guard bar/s adjacent a first diode of a diode string. For example, in one embodiment, a diode string of two or more N diodes may be coupled between I/O pad 175 and $V_{SS}$, in which case one or more guard bars may be placed adjacent a first diode that is positioned at the end of the diode string adjacent to I/O 175, however in such an alternative embodiment guard bar/s 112 would be electrically coupled to $V_{SS}$.

In the embodiment of FIG. 5A, $D_1$ is provided with one or more guard bar/s 112 that is coupled to VDD and configured as described in relation to FIGS. 1-4. As shown, circuitry 500 includes a first power supply (VDD) terminal 502, a second power supply (Vss) terminal 504, and an I/O pad 175. First and second power supply terminals 502 and 504 serve as supply rails for the circuitry. Circuitry 500 further includes a diode 508 having an anode coupled to the second power supply terminal 504 and a cathode coupled to the first power supply terminal 502. Circuitry 500 also includes a voltage 11O rail clamp 510 configured to clamp a voltage differential between the first and second power supply terminals 502 and 504 to a voltage level that is safe for other associated circuitry.

Still referring to FIG. 5A, circuitry 500 includes a p-channel metal oxide semiconductor (PMOS) field effect transistor 516 including a source coupled to first power supply terminal 502, a control terminal, and a drain coupled to I/O pad 175. Block 522 represents an N-well biasing circuit for the PMOS transistor 516 and is coupled to an N-well portion of the gate of PMOS transistor, to the drain and source terminals of PMOS transistor 516. As shown, circuit 500 also includes n-channel (NMOS) transistors 518 and 520. NMOS transistor 518 includes a drain coupled to I/O pad 175, a gate, and a source. NMOS transistor 520 includes a drain coupled to the source of NMOS transistor 518 and a source coupled to second power supply terminal 504. Circuitry 500 also includes a diode 512 having an anode terminal coupled to second power supply terminal 504 and a cathode coupled to I/O pad 175. Circuitry 100 further includes diode string 100 having multiple diodes $D_1$ to $D_N$ arranged in series. It will be understood that the disclosed diode strings may be implemented with a diode string having any number of two or more diodes to present a desired turn-on voltage for ESD circuitry, which is determined by the sum of the built-in potential of each of the diodes in the string. Diode string 100 includes a first diode ($D_1$) having an anode terminal coupled to I/O pad 175 and a cathode terminal. A last diode ($D_N$) in diode string 100 has an anode terminal coupled to a cathode terminal of a previous diode in diode string 100 and has a cathode terminal coupled to first power supply terminal 502.

In the embodiment of FIG. 5A, if an ESD voltage is applied to I/O pad 175 that has a negative potential relative to the voltage on second power supply ($V_{SS}$) terminal 504, current flows from power supply terminal 504 through diode 512 to I/O pad 175 to mitigate the negative voltage ESD event. In another example, if a voltage is applied to I/O pad 175 that exceeds the turn on voltage of diode string 100, diode string 100 directs ESD current ($I_E$) to first supply ($V_{DD}$) terminal 502, which increases the voltage potential between first and second supply terminals 502 and 504 until the voltage I/O rail clamp 110 turns on, clamping the voltage to a pre-determined voltage level (that is below a voltage rating of associated circuitry) and shunting excess current to second power supply terminal 504, reducing the voltage potential between first and second supply terminals 502 and 504.

Figure 5B:
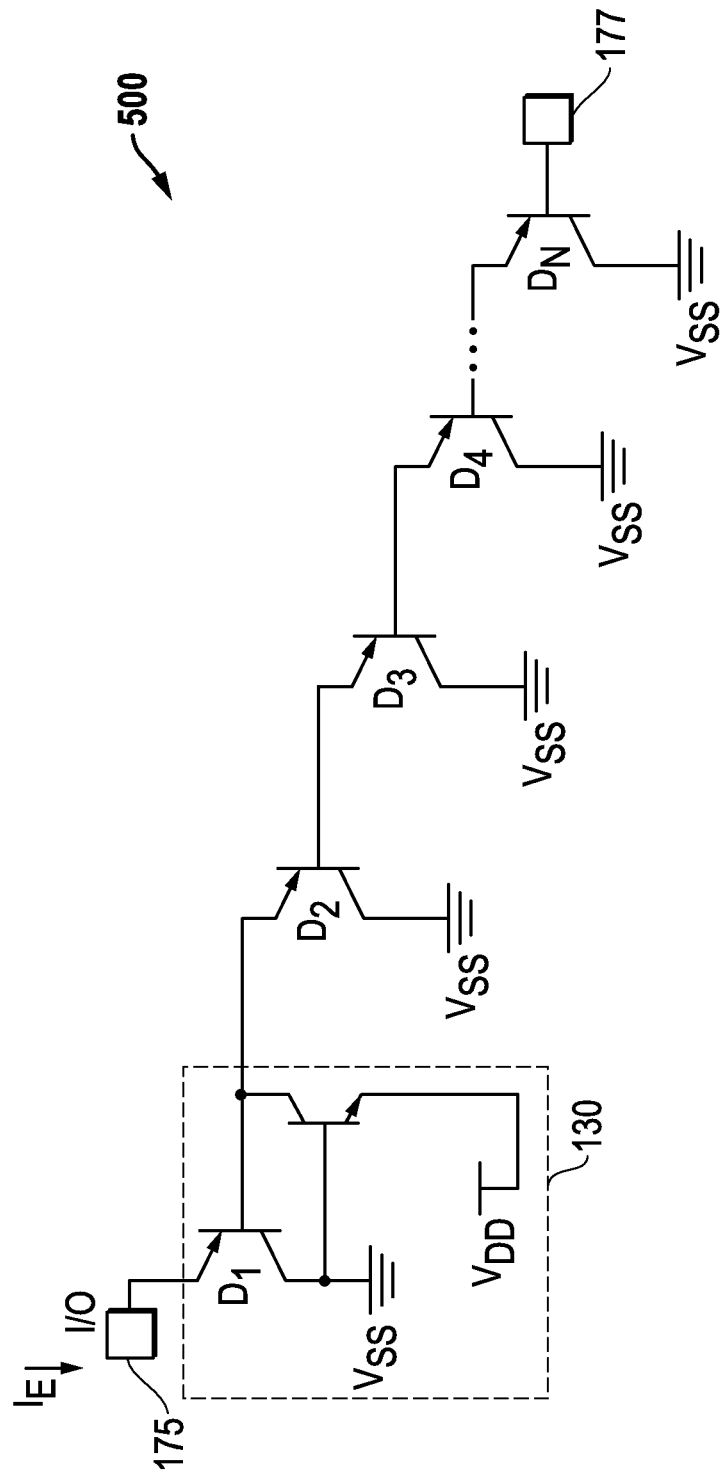
FIG. 5B illustrates a simplified schematic of signal output circuitry according to one exemplary embodiment of the disclosed circuit topologies and methods.

FIG. 5B illustrates a schematic representation of the parasitic bipolar PNP transistors that are formed by diode string 100 in which ESD current ($I_E$) at I/O pad 175 is discharged to $V_{DD}$ through a parasitic NPN transistor of the SCR 130 and away from diodes $D_2$ to $D_N$ of the diode string 100 and the corresponding individual parasitic bipolar transistors of diodes $D_2$ to $D_N$. In this regard, during such an ESD event, diodes $104_1$ to $104_N$ form a string of parasitic bipolar PNP transistors that in the absence of SCR 130 would each "dump" or otherwise discharge a portion of ESD current to ground ($V_{SS}$) via an adjacent P+ doped region 108. However, upon activation of the SCR 130, ESD current from the individual diode structures is instead discharged to $V_{DD}$ though the parasitic NPN transistor of the SCR 130 via the N+/nwell guard bars ($G_{BARS}$) 112. SCR 130 also conducts a portion of the ESD current to $V_{DD}$, and thus reduces the amount of ESD current that diodes $D_2$ to $D_N$ are required to conduct to $V_{DD}$ during an ESD event.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. A semiconductor circuit device, comprising:
a semiconductor substrate;
a diode string including two or more nwell diode structures formed in the substrate, each of the nwell diode structures comprising at least one N+ doped region and at least one P+ doped region, the N+ doped regions and P+ doped regions of the individual nwell diode structures being electrically coupled together in series to form a diode string having a first nwell diode structure disposed at a first end of the diode string and a last nwell diode structure disposed at a second and opposite end of the diode string; and
at least one N+ doped/nwell guard bar formed in the substrate adjacent at least one side of the first nwell diode structure with no other well structure physically disposed in the substrate between the first nwell diode structure and the N+ doped/nwell guard bar, the N+ doped/nwell guard bar being electrically coupled to a first power supply rail of the semiconductor device;
where the semiconductor substrate is electrically coupled to a second power supply rail of the semiconductor device that is different than the first power supply rail; and
where the at least one N+ doped/nwell guard bar is positioned adjacent the first nwell diode structure to create a silicon-controlled rectifier (SCR) between the first diode structure and the N+ doped/nwell guard bar through the semiconductor substrate.

2. The circuit device of claim 1, where the N+ doped/nwell guard bar is electrically coupled to the first power supply rail; and where the SCR is configured to discharge current of an electrostatic discharge (ESD) event from the diode string to the first power supply rail through the N+ doped/nwell guard bar.

3. The circuit device of claim 1, further comprising a P+ doped guard ring region formed in the substrate to continuously surround the first nwell diode structure and to separate the first nwell diode structure from the N+ doped/nwell guard bar; where the P+ doped guard ring region is electrically coupled to the second power supply rail of the semiconductor device.

4. The circuit device of claim 3, where the at least one P+ doped guard ring region is formed in the substrate to continuously surround and separate each of the nwell diode structures from each other of the nwell diode structures of the diode string.

5. The circuit device of claim 1, where the semiconductor substrate is a P-type substrate; and where the device further comprises a P+ doped guard ring region formed in the P-type substrate to continuously surround the first nwell diode structure and to separate the first nwell diode structure from the N+ doped/nwell guard bar; where the P+ doped guard ring region is electrically coupled to the second power supply rail of the semiconductor device; where a P+ doped region of the first nwell diode structure is electrically coupled to an output buffer signal node and an N+ doped region of the last nwell diode structure is coupled to first power supply rail; and where the SCR is configured to discharge current of an electrostatic discharge (ESD) event from the output buffer signal node to the first power supply rail through the N+ doped/nwell guard bar.

6. The circuit device of claim 5, where the SCR comprises a lateral parasitic NPN transistor formed through the P-type substrate between a N+ doped region of the first nwell diode and the N+ doped/nwell guard bar, and a vertical parasitic PNP bipolar transistor formed through a nwell of the first nwell diode structure between a P+ doped region of the first nwell diode structure and the P-type substrate, a collector of the vertical parasitic PNP bipolar transistor being coupled to a base of the lateral parasitic NPN transistor.

7. The circuit device of claim 6, where the N+/nwell guard bar is physically spaced adjacent an nwell of the first nwell diode such that a product of the β of the vertical parasitic PNP bipolar transistor of the SCR and the β of the horizontal parasitic NPN bipolar transistor of the SCR is greater than or equal to 1.

8. The circuit device of claim 1, where the at least one N+ doped/nwell guard bar comprises a N+ doped/nwell guard bar ring formed in the substrate to continuously surround the first nwell diode structure.

9. The circuit device of claim 1, where the at least one N+ doped/nwell guard bar is physically disposed in the substrate between the first nwell diode of the diode string and a second nwell diode of the diode string.

10. The circuit device of claim 1, where the last nwell diode is physically separated in the substrate from the first nwell diode by at least one other intervening nwell diode of the diode string that is electrically coupled in series between the first nwell diode and the last nwell diode.

11. Electrostatic discharge (ESD) protection circuitry, comprising the semiconductor device of claim 1; and
where a P+ doped region of the first nwell diode structure is electrically coupled to an output buffer signal node and an N+ doped region of the last nwell diode structure is coupled to first power supply rail;
where the N+ doped/nwell guard bar is electrically coupled to the first power supply rail; and
where the SCR is configured to discharge current of an electrostatic discharge (ESD) event from the output buffer signal node to the first power supply rail through the N+ doped/nwell guard bar.

12. The circuitry of claim 11, further comprising at least one P+ doped guard ring region formed in the substrate to continuously surround and separate each of the nwell diode structures from each other of the nwell diode structures of the diode string; and where the P+ doped guard ring region is electrically coupled to the second power supply rail.

13. The circuitry of claim 11, where the semiconductor substrate is a P-type substrate; and where the SCR comprises:
a lateral parasitic NPN transistor formed through the P-type substrate between a N+ doped region of the first nwell diode and the N+ doped/nwell guard bar; and
a vertical parasitic PNP bipolar transistor formed through a nwell of the first nwell diode structure between a P+ doped region of the first nwell diode structure and the P-type substrate, a collector of the vertical parasitic PNP bipolar transistor being coupled to a base of the lateral parasitic NPN transistor.

14. The circuitry of claim 13, where the N+/nwell guard bar is physically spaced adjacent an nwell of the first nwell diode such that a product of the β of the vertical parasitic PNP bipolar transistor of the SCR and the β of the horizontal parasitic NPN bipolar transistor of the SCR is greater than or equal to 1.

15. The circuitry of claim 11, where the at least one N+ doped/nwell guard bar is physically disposed in the substrate between the first nwell diode of the diode string and a second nwell diode of the diode string.

16. The circuitry of claim 11, where the last nwell diode is physically separated in the substrate from the first nwell diode by at least one other intervening nwell diode of the diode string that is electrically coupled in series between the first nwell diode and the last nwell diode.

17. A method, comprising
using the silicon-controlled rectifier (SCR) to discharge current of an electrostatic discharge (ESD) event from the diode string to the first power supply rail of the semiconductor device of claim 1 through the N+ doped/nwell guard bar.

18. The method of claim 17, where the N+ doped/nwell guard bar is electrically coupled to the first power supply rail; and where the method further comprises using the SCR to discharge current of the electrostatic discharge (ESD) event from the diode string to the first power supply rail through the N+ doped/nwell guard bar.

19. The method of claim 17, where the semiconductor substrate is a P-type substrate; and where the SCR comprises:
a lateral parasitic NPN transistor formed through the P-type substrate between a N+ doped region of the first nwell diode and the N+ doped/nwell guard bar; and
a vertical parasitic PNP bipolar transistor formed through a nwell of the first nwell diode structure between a P+ doped region of the first nwell diode structure and the P-type substrate, a collector of the vertical parasitic PNP bipolar transistor being coupled to a base of the lateral parasitic NPN transistor.

20. The method of claim 17, where the last nwell diode is physically separated in the substrate from the first nwell diode by at least one other intervening nwell diode of the diode string that is electrically coupled in series between the first nwell diode and the last nwell diode.

* * * * *